United States Patent
Yumura et al.

(10) Patent No.: US 10,629,799 B2
(45) Date of Patent: Apr. 21, 2020

(54) PIEZOELECTRIC VIBRATION ELEMENT AND PIEZOELECTRIC VIBRATION DEVICE

(71) Applicant: KYOCERA Crystal Device Corporation, Higashine-shi, Yamagata (JP)

(72) Inventors: Masatoshi Yumura, Higashine (JP); Masahiko Goto, Higashine (JP)

(73) Assignee: KYOCERA CORPORATION, Kyoto (JP)

( * ) Notice: Subject to any disclaimer, the term of this patent is extended or adjusted under 35 U.S.C. 154(b) by 437 days.

(21) Appl. No.: 15/426,235

(22) Filed: Feb. 7, 2017

(65) Prior Publication Data
US 2018/0151793 A1    May 31, 2018

(30) Foreign Application Priority Data
Nov. 30, 2016   (JP) ................. 2016-232091

(51) Int. Cl.
| | | |
|---|---|---|
| H01L 41/047 | (2006.01) | |
| H03H 9/13 | (2006.01) | |
| H03H 9/10 | (2006.01) | |

(52) U.S. Cl.
CPC ......... *H01L 41/047* (2013.01); *H03H 9/1021* (2013.01); *H03H 9/132* (2013.01)

(58) Field of Classification Search
CPC ............................. H01L 41/047; H03H 9/1021
USPC ....... 310/348, 370, 344, 365, 366, 367, 320, 310/321, 322, 368, 361, 333, 313 D, 353, 310/346, 351, 363, 150, 187, 193, 195
See application file for complete search history.

(56) References Cited

U.S. PATENT DOCUMENTS

| | | | | |
|---|---|---|---|---|
| 6,191,524 | B1 * | 2/2001 | Sasaki | H03H 9/02133 310/367 |
| 7,388,454 | B2 * | 6/2008 | Ruby | H03H 3/02 310/322 |
| 8,638,022 | B2 * | 1/2014 | Yamashita | H03H 9/1021 310/320 |
| 8,710,715 | B2 * | 4/2014 | Naito | H03H 3/04 310/320 |
| 9,178,771 | B2 * | 11/2015 | David | H04L 43/18 |
| 10,122,343 | B2 * | 11/2018 | Obata | H03H 9/19 |
| 10,425,059 | B2 * | 9/2019 | Obara | H03H 3/04 |

FOREIGN PATENT DOCUMENTS

| | | |
|---|---|---|
| JP | 2014-11647 A | 1/2014 |
| JP | 2016-034107 * | 3/2016 |
| JP | 2016-34107 A | 3/2016 |

* cited by examiner

*Primary Examiner* — Thomas M Dougherty
*Assistant Examiner* — Karen B Addison
(74) *Attorney, Agent, or Firm* — Westerman, Hattori, Daniels & Adrian, LLP

(57) ABSTRACT

A crystal vibration element includes a plate shaped crystal blank including a pair of long sides and pair of short sides when viewed on a plane, and a pair of excitation electrodes superimposed on the two major surfaces of the crystal blank. When viewed on a plane, each of the pair of excitation electrodes includes a pair of short edges extending along a pair of short sides on inner sides of the pair of short sides, and a pair of long edges extending along a pair of long sides on inner sides of the pair of long sides. The pair of short edges are shaped as straight line parallel to the pair of short sides, while the pair of long edges are shaped outwardly bulging when viewed on a plane.

9 Claims, 4 Drawing Sheets

PIEZOELECTRIC VIBRATION ELEMENT AND PIEZOELECTRIC VIBRATION DEVICE

TECHNICAL FIELD

The present disclosure relates to a piezoelectric vibration element and a piezoelectric vibration device. The piezoelectric vibration device is for example a crystal unit or a crystal oscillator.

BACKGROUND ART

The crystal vibration element used in a crystal unit or crystal oscillator etc. for example has a plate shaped crystal blank and a pair of excitation electrodes superimposed on a pair of major surfaces (largest surfaces: front and back of the plate shaped member) of the crystal blank. As such a crystal vibration element, for example there is known an element in which the planar shape of the crystal blank is rectangular and the planar shapes of the pair of excitation electrodes are rectangular or oval (Patent Literature 1 and 2).

CITATION LIST

Patent Literature

Patent Literature 1: Japanese Patent Publication No. 2014-011647A

Patent Literature 2: Japanese Patent Publication No. 2016-034107A

SUMMARY OF INVENTION

A piezoelectric vibration element according to one embodiment of the present disclosure includes a plate shaped piezoelectric blank including a pair of long sides and pair of short sides when viewed on a plane, and a pair of excitation electrodes superimposed on the two major surfaces of the piezoelectric blank. When viewed on a plane, each of the pair of excitation electrodes includes a pair of short edges extending along the pair of short sides on the inner sides of the pair of short sides, and a pair of long edges extending along the pair of long sides on the inner sides of the pair of long sides. The pair of short edges are shaped as straight lines parallel to the pair of short sides, while the pair of long edges are shaped outwardly bulging when viewed on a plane.

In one example, the piezoelectric blank forms a flat plate shape.

In one example, the piezoelectric blank includes a mesa part on which the pair of excitation electrodes are superimposed, and an outer circumferential part which is thinner than the mesa part and surrounds the mesa part when viewed on a plane. The mesa part, when viewed on a plane, is shaped so as to have a pair of second long sides which are parallel to the above pair of long sides and includes a pair of second short sides which are parallel to the above pair of short sides. The pair of excitation electrodes are smaller than the mesa part.

In one example, when the wavelength of the standing wave due to the bending vibration which propagates through the piezoelectric blank in the long direction thereof is $\lambda_L$, each of the pair of short edges is located within a range of $\frac{1}{8}\lambda_L$ from any node of the standing wave due to the bending vibration which propagates through the long direction.

In one example, when the wavelength of the standing wave due to the bending vibration which propagates through the piezoelectric blank in the short direction thereof is $\lambda_W$, the central part of each of the pair of long edges is located within a range of $\frac{1}{8}\lambda_W$ from any node of the standing wave due to the bending vibration which propagates through the short direction.

In one example, each of the pair of long edges forms a line symmetric curved shape having a line which is parallel to the pair of short edges and is equally distant from the pair of short edges as the symmetric axis.

In one example, the piezoelectric vibration element further includes a pair of extraction electrodes which are connected to the pair of excitation electrodes. Each of the pair of extraction electrodes is connected to only one of the pair of short edges among the pair of long edges and pair of short edges of the excitation electrode to which it is connected.

In one example, the piezoelectric vibration element further includes a pair of extraction electrodes which are connected to the pair of excitation electrodes. The pair of extraction electrodes include a pair of pads arranged along one of the pair of short sides.

A piezoelectric vibration device according to one embodiment of the present disclosure includes the above piezoelectric vibration element and a package packaging the piezoelectric vibration element.

DESCRIPTION OF EMBODIMENTS

Figure 1:
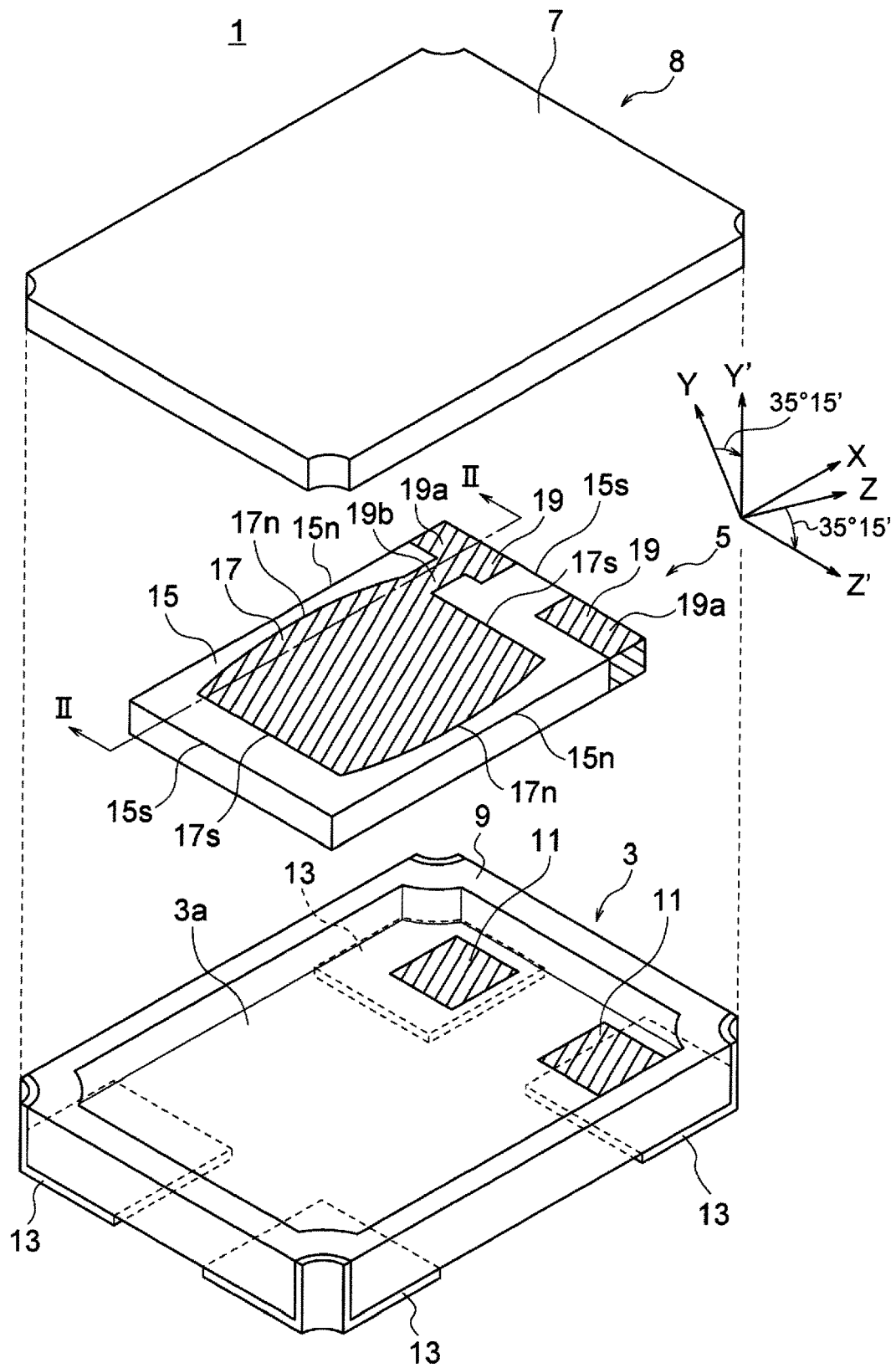
FIG. 1 is a broken down perspective view schematically showing the configuration of a crystal unit according to a first embodiment.

Below, embodiments of the present disclosure will be explained with reference to the drawings. Note that, the drawings used in the following explanation are schematic ones. The dimensions and ratios etc. in the drawings do not always coincide with the actual ones. For convenience, sometimes the surface of a layer-shaped member (that is, a surface which is not a cross-section) is given hatching.

In the crystal unit or crystal vibration element in the present disclosure, any part may be defined as an "upper part" or "lower part". In the following description, for convenience, sometimes the upper parts (+Y'-axis direction) on the drawing sheets in FIG. 1 and FIG. 2 will be defined as the upper parts and an "upper surface" or "lower surface" or another term will be used. Further, a simple term such as "viewed on a plane" or "viewed transparently" means "viewing in a vertical direction" which is defined as described for convenience above unless otherwise noted.

First Embodiment (Overall Structure of Crystal Unit)

Figure 2:
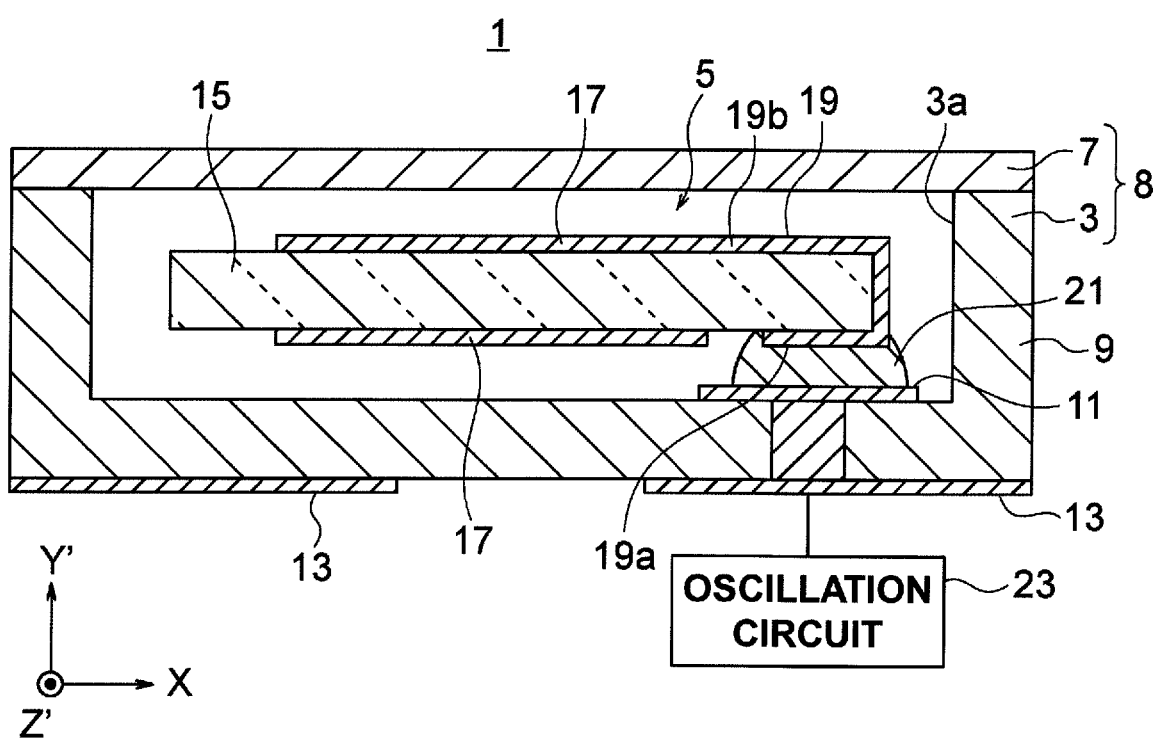
FIG. 2 is a cross-sectional view taken along the II-II line in FIG. 1 and shows the configuration of the crystal unit in FIG. 1.

FIG. 1 is a broken down perspective view schematically showing the configuration of a crystal unit 1 according to an embodiment of the present disclosure. Further, FIG. 2 is a cross-sectional view taken along the II-II line in FIG. 1 and shows the configuration of the crystal unit 1.

The crystal unit 1 is for example an electronic part given a schematically thin box shape as a whole. The dimensions thereof may be suitably set. For example, in relatively small one, the length of the long side (X-axis direction) or short side (Z'-axis direction) is 1 to 2 mm, and the thickness (Y'-axis direction) is 0.2 to 0.4 mm.

The crystal unit 1 for example has an element mounting member 3 having a recess 3a formed therein, a crystal vibration element 5 (below, sometimes "crystal" will be omitted) accommodated in the recess 3a, and a lid 7 closing the recess 3a.

The vibration element 5 is a part which generates vibration utilized for generation of an oscillation signal. The element mounting member 3 and lid 7 configure a package 8 packaging the vibration element 5. The recess 3a in the element mounting member 3 is sealed by the lid 7. Its inside is for example evacuated, or a suitable gas (for example nitrogen) is sealed therein.

The element mounting member 3 for example has a base body 9 forming the main part of the element mounting member 3, a pair of element mounting pads 11 for mounting the vibration element 5, and a plurality of (four in the illustrated example) external terminals 13 for mounting the crystal unit 1 on a not shown circuit board etc.

The base body 9 is made of a ceramic or another insulating material and forms the above recess 3a. The element mounting pads 11 are configured by a conductive layer made of a metal or the like and are positioned on the bottom surface of the recess 3a. The external terminals 13 are configured by a conductive layer made of a metal or the like and are positioned on the lower surface of the base body 9. The element mounting pads 11 and the external terminals 13 are connected to each other by conductors (FIG. 2. Notation is omitted.) arranged in the base body 9. The lid 7 is for example formed by a metal and is joined to the upper surface of the element mounting member 3 by seam welding or the like.

The vibration element 5, for example, has a crystal blank 15, a pair of excitation electrodes 17 for applying voltage to the crystal blank 15, and a pair of extraction electrodes 19 for mounting the vibration element 5 on a pair of element mounting pads 11.

The vibration element 5 is roughly plate shaped and is accommodated in the recess 3a so as to face the bottom surface of the recess 3a. Further, the pair of extraction electrodes 19 are joined to the pair of element mounting pads 11 by a pair of bumps 21 (FIG. 2). Due to this, the vibration element 5 is supported upon the element mounting member 3 in a cantilever manner. Further, the pair of excitation electrodes 17 are electrically connected to the pair of element mounting pads 11 through the pair of extraction electrodes 19 and consequently electrically connected to any two among the plurality of external terminals 13. The bumps 21 are for example made of a conductive adhesive. The conductive adhesive is for example formed by mixing a conductive filler into a thermosetting resin.

The crystal unit 1 configured in this way is for example arranged on the mounting surface of a not shown circuit board while making the lower surface of the element mounting member 3 face the mounting surface and is mounted on the circuit board by joining the external terminals 13 to the pads of the circuit board by solder or the like. On the circuit board, for example, an oscillation circuit 23 (FIG. 2) is configured. The oscillation circuit 23 applies an AC voltage through the external terminals 13 and element mounting pads 11 to the pair of excitation electrodes 17 and generates an oscillation signal. At this time, the oscillation circuit 23 utilizes for example fundamental wave vibration in the thickness-slip vibration of the crystal blank 15. Overtone vibration may be utilized as well.

(Configuration of Crystal Vibration Element)

The crystal blank 15 is for example a so-called AT-cut plate. That is, as shown in FIG. 1, in a quartz crystal, when defining an orthogonal coordinate system XY'Z' by rotating an orthogonal coordinate system XYZ comprised of an X-axis (electric axis), Y-axis (mechanical axis), and Z-axis (optical axis) by 30° to 40° (35° 15' as an example) around the X-axis, the crystal blank 15 is formed as a plate cut parallel to the XZ' plane.

The crystal blank 15 is for example formed as a flat plate. That is, the crystal blank 15 is given a plate shape roughly having a constant thickness as a whole. Although notation is not particularly attached, it has a pair of major surfaces (notation is omitted) and a plurality of side surfaces connecting the pair of major surfaces. The term "major surfaces" designates the broadest surfaces (front and back of the plate shaped member).

Note that, when the outer shape of the crystal blank is formed by etching, a relatively large error (like system error) occurs due to anisotropy of the quartz crystal with respect to etching. This error is sometimes intentionally utilized. In the explanation of the present disclosure, existence of such error will be ignored. For example, in an actual crystal blank 15, sometimes the side surfaces are not perpendicular to the major surfaces, but are inclined, or the side surfaces do not become planes but have outward bulging shapes. However, the illustration and explanation of such inclination and/or bulging will be omitted. When judging whether third party products relate to the art of the present disclosure as well, differences due to such error may be ignored. Note that, naturally some incidental error may be ignored.

As shown in FIG. 1, the shape of the crystal blank 15 when viewed on a plane is rectangular (here, a square is not included). That is, the crystal blank 15 (major surface thereof) has a pair of long sides $15n$ and a pair of short sides $15s$ each connecting each two ends of the pair of long sides $15n$ to each other. Note that, in the present disclosure, a rectangle (shape having a pair of long sides and pair of short sides) includes shapes where the corner portions are chamfered. Unless otherwise noted, in an AT-cut plate, for example, the major surfaces are surfaces which are schematically parallel to the XZ' plane, the long sides $15n$ are sides which are schematically parallel to the X-axis, and the short sides $15s$ are sides which are schematically parallel to the Z'-axis.

The thickness of the crystal blank 15 is set based on a desired natural frequency for the thickness-slip vibration. For example, where use is made of a fundamental wave vibration, if the natural frequency is F (MHz), the fundamental equation for finding the thickness t (μm) of the crystal blank 15 corresponding to this natural frequency F is t=1670/F. Note that, in actuality, the thickness of the crystal blank 15 is made a value obtained by fine adjustment from the value of the fundamental equation taking a weight of the excitation electrodes 17 etc. into account as well.

The various dimensions of the crystal blank 15 may be suitably set based on simulation calculations and experiments etc. from various viewpoints such as reduction of the equivalent series resistance. When mentioning one example, for example, the length of the long side $15n$ is 600 μm to 1 mm, the length of the short side $15s$ is 500 μm to 700 μm (however, shorter than the length of the long side 15*n*), and the thickness of the crystal blank 15 is 40 µm to 70 µm.

The pair of excitation electrodes 17 and pair of extraction electrodes 19 are configured by a conductive layer superimposed on the surface of the crystal blank 15. The conductive layer is made of for example Au (gold), Ag (silver), Au—Ag alloy, or another metal. The conductive layer may be configured by a plurality of layers made of materials which are different from each other as well. The thickness of the conductive layer may be suitably set. However, when showing one example, it is 0.05 µm to 0.3 µm. Note that, in FIG. 2 etc., the conductive layer is shown so as to be thicker than the actual thickness.

The pair of excitation electrodes 17 are positioned on the pair of major surfaces of the crystal blank 15. The pair of excitation electrodes 17 for example have the same shapes as each other and are wholly superimposed on each other when viewed transparently. As shown in FIG. 1, the shape of the excitation electrode 17 is a shape (barrel shape) which is seemed as if a pair of long sides of a rectangle bulge outward. That is, in the excitation electrode 17, the pair of short edges 17*s* extending along a pair of short sides 15*s* of the crystal blank 15 on the inner sides of the pair of short sides 15*s* form linear shapes parallel to the pair of short sides 15*s*, while the pair of long edges 17*n* extending along the pair of long sides 15*n* of the crystal blank 15 on the inner sides of the pair of long sides 15*n* and connecting two ends of the pair of short edges 17*s* to each other have outward bulging shapes. One of characteristic features of the art of the present disclosure resides in this shape of the excitation electrode 17.

The pair of extraction electrodes 19 for example extend outward from the pair of excitation electrodes 17 toward one side of the X-axis direction (+X side in the present embodiment) and have a pair of pads 19*a* joined with a pair of bumps 21 on at least one major surface between the pair of major surfaces of the crystal blank 15. In the illustrated example, the vibration element 5 is formed rotationally symmetrically by 180° around the X-axis so that either of the pair of major surfaces may be made to face the bottom surface of the recess 3*a*. Therefore, the pair of extraction electrodes 19 have a pair of pads 19*a* on each of the pair of major surfaces (two pairs of pads 19*a* in total). Note that, the excitation electrode 17 which is positioned on one major surface between the pair of major surfaces and the pad 19*a* which is positioned on the other major surface are connected through the side surface of the crystal blank 15 (side surface positioned at the short side 15*s* and/or side surface positioned at the long side 15*n*).

(Details of Shape of Excitation Electrode)

Figure 3A:
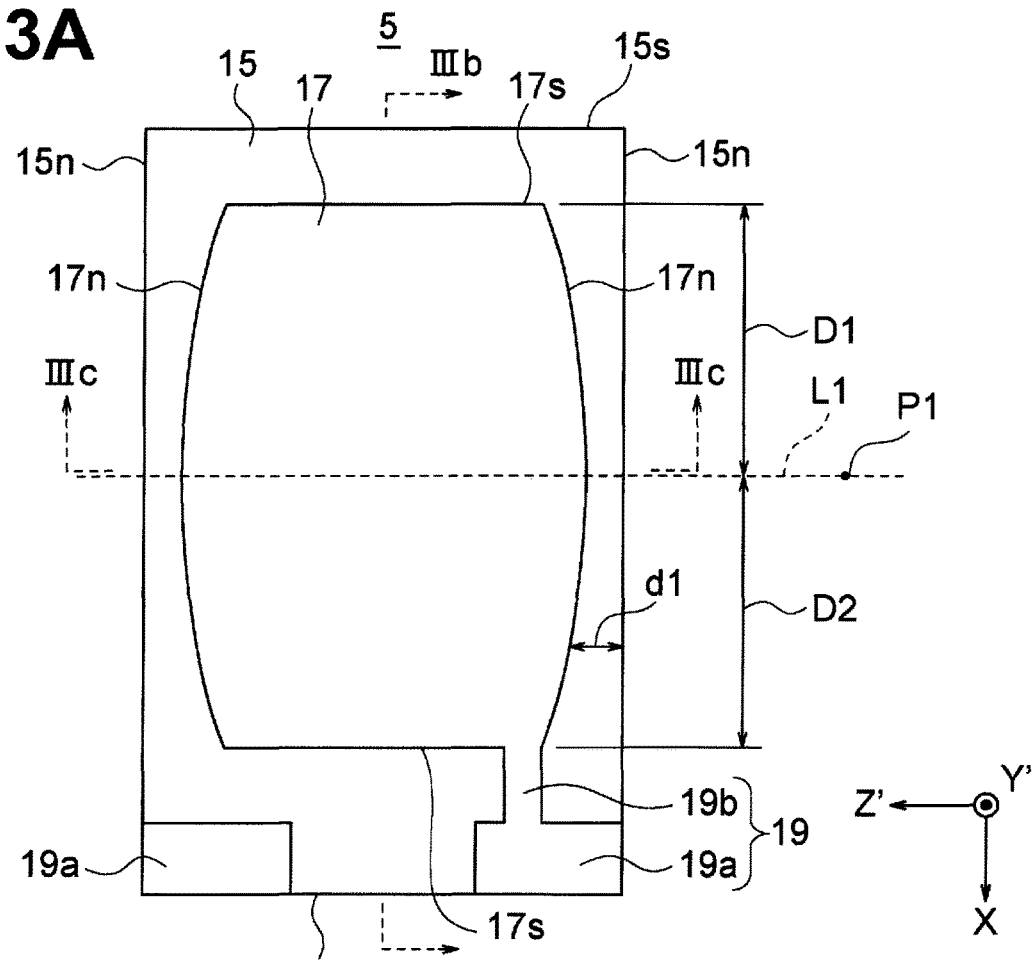
FIG. 3A is a plan view showing a crystal vibration element of the crystal unit in FIG. 1.
Figure 3B:
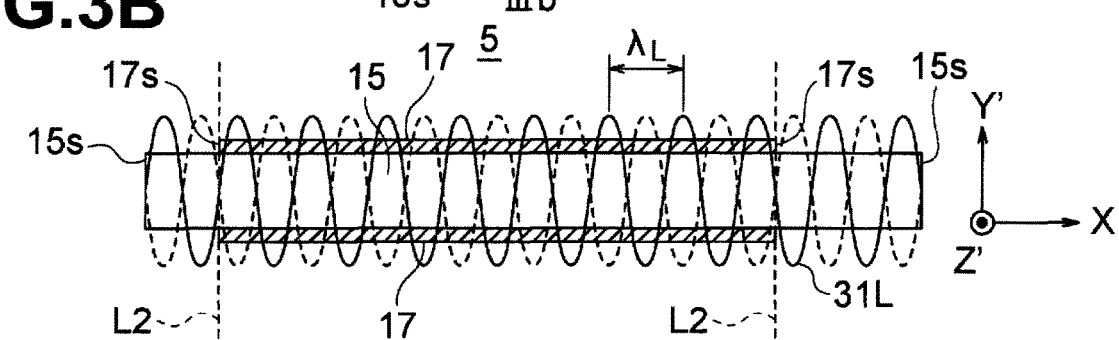
FIG. 3B is a cross-sectional view taken along the IIIb-IIIb line in FIG. 3A.
Figure 3C:
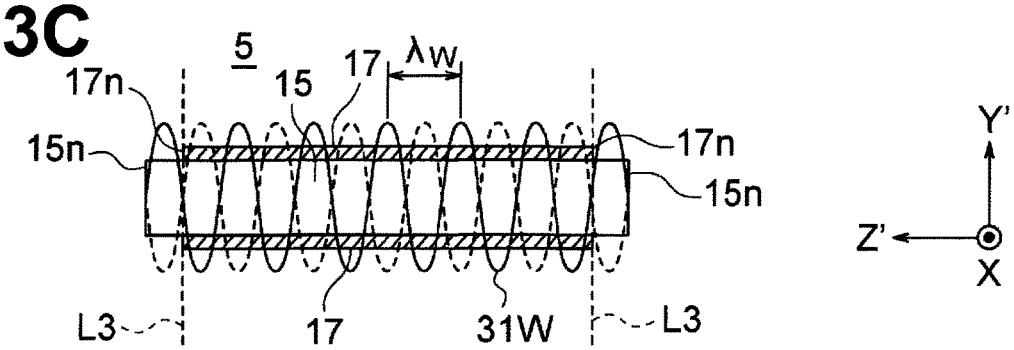
FIG. 3C is a cross-sectional view taken along the IIIc-IIIc line in FIG. 3A.

FIG. 3A is a plan view showing the vibration element 5. FIG. 3B is a cross-sectional view taken along the IIIb-IIIb line in FIG. 3A. FIG. 3C is a cross-sectional view taken along the IIIc-IIIc line in FIG. 3A. Note that, in FIG. 3B and FIG. 3C, the cross-section of the crystal blank 15 is shown without hatching.

The pair of long edges 17*n* of the excitation electrode 17 has a shape bulging outward as described above. From another viewpoint, in the long edge 17*n*, the portion on the center side is closer to the long side 15*n* of the crystal blank 15 than the portions on its end part sides. Specifically, for example, the long edge 17*n* is comprised of a curve which bulges outward. This curve, for example, when assuming a line L1 (FIG. 3A) which is parallel to the pair of short edges 17*s* and is equally distant from the pair of short edges 17*s* (distance D1=distance D2), has a line symmetric shape about this line L1 as the symmetric axis. As such a curve that is line symmetric in the length direction, for example there can be mentioned an arc having a point P1 positioned on the line L1 as the center. Note that, in FIG. 3A, for convenience of illustration, the point P1 does not become an accurate center of the arc-shaped long edge 17*n*.

When applying an AC voltage to the two major surfaces of the crystal blank 15, in the crystal blank 15, not only thickness-slip vibration of the object used for, but also bending vibration as unnecessary vibration is generated. As a result, for example, as shown in FIG. 3B, a standing wave 31L is generated due to a bending vibration having the long direction of the crystal blank 15 as the propagation direction (a standing wave having antinodes and nodes arranged in the long direction) and/or a standing wave 31W is generated due to a bending vibration having the short direction of the crystal blank 15 as the propagation direction (a standing wave having antinodes and nodes arranged in the short direction) as shown in FIG. 3C.

Here, the standing wave 31L is made one most easily coupled with the thickness-slip vibration of the object used for among the standing waves due to the bending vibration having the long direction of the crystal blank 15 as the propagation direction. In the same way, the standing wave 31W is made one most easily coupled with the thickness-slip vibration of the object used for among the standing waves due to the bending vibration having the short direction of the crystal blank 15 as the propagation direction. The wavelength $\lambda_L$ (µm) of the standing wave 31L and wavelength $\lambda_W$ (µm) of the standing wave 31W may be found according to for example simulation calculations or experiments.

Note that, the frequency-temperature characteristic is for example shown by the amount of change of the natural frequency (oscillation frequency of the vibration element) with respect to a temperature change. In an AT-cut plate, the amount of change of the natural frequency schematically becomes a third-order function having the temperature as a variable.

As indicated by a dotted line L2 in FIG. 3B, the short edge 17*s* of the excitation electrode 17 coincides with a node of the standing wave 31L. Note that, the position of the short edge 17*s* may be bit deviated from the position of the node (dotted line L2) as well. The amount of deviation is for example $\lambda_L/8$ or less or $\lambda_L/16$ or less.

In the same way, as indicated by a dotted line L3 in FIG. 3C, a predetermined portion of the long edge 17*n* of the excitation electrode 17 coincides with a node of the standing wave 31W. Note that, the predetermined portion is for example the central part of the long edge 17*n* (portion on the line L1) or a portion which is positioned on the outermost side in the long edge 17*n* (the two are the same in the present embodiment). Further, the position of the predetermined portion may be bit deviated from the position of the node (dotted line L3). The amount of deviation is for example $\lambda_W/8$ or less or $\lambda_W/16$ or less.

Each of the extraction electrodes 19 for example has a pair of wiring parts 19*b* which extend from the excitation electrodes 17 and pair of pads 19*a* which are connected to the pair of wiring parts 19*b* and are positioned on the lower surface of the crystal blank 15 (as already explained, a pair of pads 19*a* are provided also on the upper surface in the present embodiment). The wiring parts 19*b* for example extend outward from only a short edge 17*s* among the long edges 17*n* and the short edges 17*s*. The short edge 17*s* from which the wiring parts 19*b* extend outward is for example the short edge 17*s* which is positioned on the +X side between the pair of short edges 17*s*. Naturally, it may be the short edge 17*s* on the −X side as well. The pair of pads 19*a* are formed broader than the wiring parts 19b in the width direction of the wiring parts 19b and are arranged along a short side 15s of the crystal blank 15.

As described above, in the present embodiment, the vibration element 5 has a plate shaped crystal blank 15 having a pair of long sides 15n and pair of short sides 15s when viewed on a plane and the pair of excitation electrodes 17 superimposed on the two major surfaces of the crystal blank 15. Each of the pair of excitation electrodes 17 has, when viewed on a plane, a pair of short sides 17s which extend along the pair of short sides 15s on the inner sides of the pair of short sides 15s and a pair of long edges 17s which extend along the pair of long sides 15n on the inner sides of the pair of long sides 15n. The pair of short edges 17s form linear shapes parallel to the pair of short sides 15s, and the pair of long edges 17n are shaped bulging outward when viewed on a plane.

Further, from another viewpoint, the crystal unit 1 according to the present embodiment has the vibration element 5 as described above and a package 8 packaging the vibration element 5.

Accordingly, the distance dl (FIG. 3A) between the long side 15n and the long edge 17n differs according to the position in the long direction of the crystal blank 15. As a result, for example, it is possible to reduce the chance of a standing wave depending upon the distance dl (one other than the above standing wave 31W) being generated over a relatively long range of the long direction of the crystal blank 15 and therefore suppress coupling of the standing wave with the thickness-slip vibration of the object used. Consequently, for example, it is possible to reduce the chance of a rise of the equivalent series resistance at a specific temperature and/or occurrence of local disturbance in the frequency temperature characteristic of the vibration element 5.

Further, each excitation electrode 17 forms not an oval shape, but a barrel shape. Therefore, for example, it is possible to design a rectangular excitation electrode first, then design the excitation electrode 17 in the present disclosure so as to further improve its characteristics. Accordingly, for example, at the time when the optimum values are sought for the film-forming amount and electrode dimensions of the rectangular excitation electrode or the time when the improvement of characteristics is difficult by a change of these values, the characteristics can be further improved. From another viewpoint, it is possible to utilize know-how in the design of rectangular excitation electrodes.

Note that, the degree of bulging of a long edge 17n may be suitably set. By making a long edge 17n bulge to a certain extent to the outer side from a straight line parallel to the long side 15n, generation of a standing wave depending upon the distance dl can be suppressed to a certain extent. The inventors of the present application produced prototypes of vibration elements 5 while changing the curvature radius of the long edges 17n within a range of about 15 times to 25 times the length of the short edges 17s and investigated their characteristics. They confirmed that the characteristics were improved at each curvature radius.

Further, in the present embodiment, the crystal blank 15 exhibits a flat plate shape.

In such a crystal blank 15, compared with a mesa type crystal blank (see second embodiment which will be explained later) etc., energy leaks to the vicinity of the outer edge of the crystal blank 15, therefore vibration is apt to occur. Accordingly, improvement of the characteristics by the effect of suppressing generation of a standing wave by making the long edges 17n bulge to the outside is easily realized.

Further, in the present embodiment, when the wavelength of the standing wave 31L due to the bending vibration propagating through the crystal blank 15 in the long direction thereof is $\lambda_L$, each of the pair of short edges 17s is positioned within a range of $\frac{1}{8}\lambda_L$ from the node of the standing wave 31L.

Accordingly, for example, compared with an embodiment where a short edge 17s is positioned on the antinode of the standing wave 31L (this embodiment is also included in the art according to the present disclosure), the vibration due to the standing wave 31L at the short edge 17s is small. As a result, for example, the chance of the standing wave 31L being coupled with the thickness-slip vibration and exerting an influence upon the frequency-temperature characteristic of the vibration element 5 is reduced.

Further, in the present embodiment, when defining the wavelength of the standing wave 31W due to the bending vibration propagating through the crystal blank 15 in its short direction as $\lambda_W$, the center part of each of the pair of long edges 17n is positioned within a range of $\frac{1}{8}\lambda_W$ from the node of the standing wave 31W.

Accordingly, for example, compared with an embodiment where a center part of a long edge 17n is positioned on the antinode of the standing wave 31W (this embodiment is also included in the art according to the present disclosure), the vibration due to the standing wave 31W in the center part of the long edge 17n is small. As a result, for example, the chance of the standing wave 31W being coupled with the thickness-slip vibration at the center of the long direction of the crystal blank 15 and exerting an influence upon the frequency-temperature characteristic of the vibration element 5 is reduced.

Further, in the present embodiment, each of the pair of long edges 17n forms a line symmetric curved shape about the line L1 parallel to the pair of short edges 17s and equally distant from the pair of short edges 17s as the symmetric axis.

Here, the shape of the distribution of vibration energy (shape of a contour lines of energy) becomes circle or oval centered at the center (figure center: point where primary moment around that is 0) of the excitation electrode 17. Accordingly, by forming the shape of a long edge 17n as described above, the shape of the excitation electrode 17 can be made to approach the shape of the distribution of vibration energy, therefore an energy confinement effect can be efficiently obtained.

Further, in the present embodiment, the vibration element 5 further has the pair of extraction electrodes 19 which are connected to the pair of excitation electrodes 17. Each of the pair of extraction electrodes 19 is connected to only one of the pair of short edges 17s between the pair of long edges 17n and pair of short edges 17s of the excitation electrode 17 to which it is connected.

Accordingly, for example, compared with an embodiment where the pair of extraction electrodes 19 extend outward from both of the long edges 17n and the short edges 17s or from only the long edges 17n (these embodiments are also included in the art according to the present disclosure as well), the length of a long edge 17n is not reduced. As a result, for example, the effect exerted because of the outward bulging shape of the long edge 17n is manifested more. Further, for example, since each extraction electrode 19 does not extend outward from a long edge 17n, even if the bulge of the long edge 17n is changed, the area of the extraction electrode 19 does not change. Consequently, change of the electric field applied to the crystal blank 15 by the extraction electrodes 19 is suppressed. As a result, for example, the chance of unintended spurious noise due to the change of design of a long edge 17n is reduced, therefore change of design is facilitated.

Further, in the present embodiment, the pair of extraction electrodes 19 include the pair of pads 19a which are arranged along one of the pair of short sides 15s.

Accordingly, for example, even if changing the bulge of a long edge 17n, the distance between the long edge 17n and the pair of extraction electrodes 19 does not change. Consequently, change of the electric field formed between the excitation electrodes 17 and the extraction electrodes 19 is suppressed. As a result, for example, compared with an embodiment where a short edge 17s is given a bulging shape and adjusting this bulge, the chance of unintended spurious noise is reduced.

Further, in the present embodiment, the crystal blank 15 is an AT-cut crystal blank, and the pair of pads 19a are arranged along the short side 15s on the +X side.

Accordingly, the vibration element 5 is supported in a cantilever state with the +X side as the fixed end. In this case, for example, compared with an embodiment where the vibration element 5 is supported in a cantilever state with the −X side as the fixed end (this embodiment is also included in the art according to the present disclosure), the frequency-temperature characteristic can be improved. As a result, combined with the effect of improvement of characteristics by giving a bulging shape to a long edge 17n, a vibration element 5 excellent in the frequency-temperature characteristic can be realized.

Second Embodiment

In the following explanation, configurations the same as or similar to the configurations of the first embodiment will sometimes be assigned the notations attached to the configurations in the first embodiment and sometimes the explanations will be omitted. Regarding configurations corresponding (similar) to the configurations of the first embodiment, even if assigned notations which are different from those of the configurations of the first embodiment, the matters not particularly mentioned may be the same as those of the configurations in the first embodiment.

Figure 4:
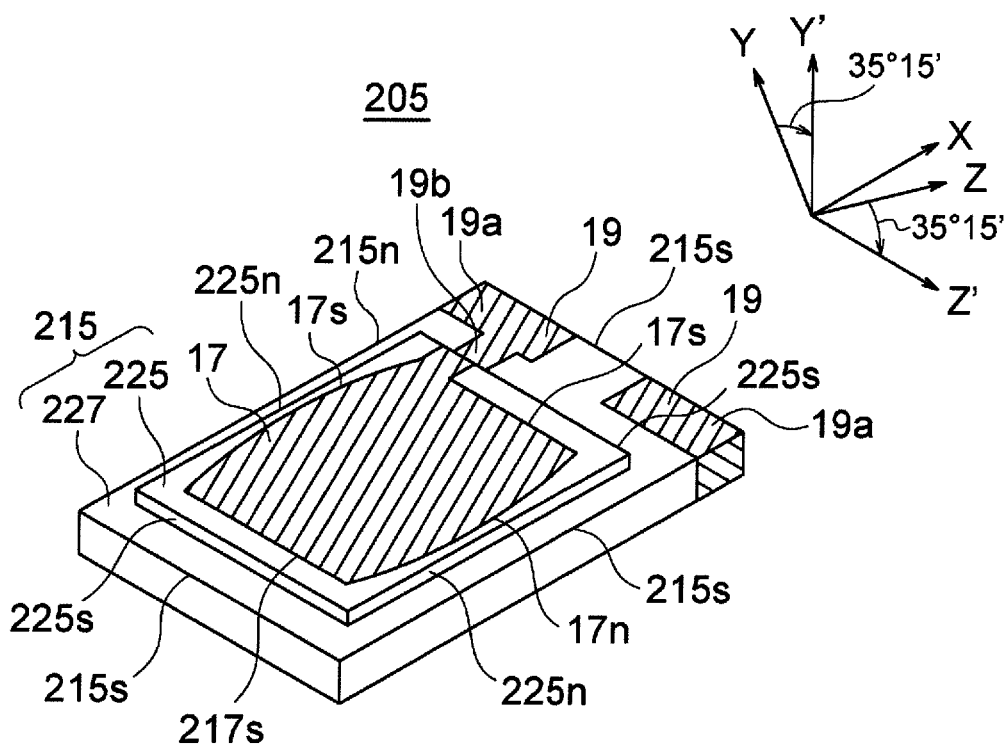
FIG. 4 is a perspective view of a crystal vibration element according to a second embodiment.

FIG. 4 is a perspective view showing a crystal vibration element 205 according to a second embodiment.

The vibration element 205, for example, in the same way as the vibration element 5 in the first embodiment, is packaged by a package 8 including an element mounting member 3 and lid 7 and configures a crystal unit.

The vibration element 205 differs from the vibration element 5 in the first embodiment only in the point that it is a so-called "mesa type". The excitation electrodes 17 and extraction electrodes 19 are basically the same as those in the first embodiment. However, due to the vibration element 205 being a mesa type, the extraction electrodes 19 have step differences. Naturally, the specific dimensions may be suitably set in accordance with the vibration element 205 being a mesa type.

The crystal blank 215 of the mesa type vibration element 205 has a mesa part 225 and an outer circumferential part 227 which surrounds the mesa part 225 when viewed on a plane and is thinner in thickness between the pair of major surfaces (Y'-axis direction) than the mesa part 225. By such a shape, for example, the energy confinement effect is improved.

The mesa part 225 is for example a plate shape having a pair of major surfaces which are parallel to each other. The planar shape of the mesa part 225 is for example a rectangle (here, not including a square) and has a pair of long sides 225n and pair of short sides 225s. In the AT-cut plate, for example, the major surfaces of the mesa part 225 are the surfaces substantially parallel to the XZ' plane, the long sides 225n are sides substantially parallel to the X-axis, and the short sides 225s are side substantially parallel to the Z'-axis.

The outer circumferential part 227, for example, when ignoring the mesa part 225, is a plate shape having a pair of major surfaces which are parallel to each other. The shape of the outer edge of the outer circumferential part 227 is the planar shape of the crystal blank 215 as a whole and is the same as the planar shape of the crystal blank 15 in the first embodiment. That is, the outer circumferential part 227 (crystal blank 215) has a pair of long sides 215n and pair of short sides 215s. In the AT-cut plate, for example, the major surfaces of the outer circumferential part 227 are the surface substantially parallel to the XZ' plane, the long sides 215n are sides substantially parallel to the X-axis, and the short sides 215s are sides substantially parallel to the Z'-axis.

When viewed on a plane, the mesa part 225 is, for example, with respect to the outer edges of the crystal blank 215 (outer circumferential part 227), positioned at the center in the Z'-axis direction and is displaced to one side (opposite side to the extraction electrodes 19) in the X-axis direction. However, the mesa part 225 may be positioned at the center of the crystal blank 15 in the X-axis direction as well.

In the Y'-axis direction, the outer circumferential part 227 is positioned at the center of the mesa part 225. That is, the height of the mesa part 225 from the outer circumferential part 227 (amount cut into outer circumferential part 227 for making crystal blank 215 the mesa type) is the same between the pair of major surfaces of the crystal blank 215.

The thickness of the mesa part 225 is set based on the desired natural frequency for the thickness-slip vibration in the same way as the thickness of the crystal blank 15 in the first embodiment. The thickness of the outer circumferential part 227 is suitably set from the viewpoint of the energy confinement effect etc. For example, the difference of height between the major surface of the mesa part 225 and the major surface of the outer circumferential part 227 on one side of the pair of major surfaces of the crystal blank 215 (amount cut into outer circumferential part 227) is 5% to 15% of the thickness of the mesa part 225 and is for example about 10%.

The various dimensions of the crystal blank 215 may be suitably set in the same way as the first embodiment. When giving one example, the length of a long side 215n is 600 μm to 1 mm, the length of a short side 215s is 500 μm to 700 μm (however, shorter than the length of the long side 215n), the thickness of the mesa part 225 is 40 μm to 70 μm, the length of a long side 225n is 450 μm to 750 μm (however, shorter than the length of the long side 215n), and the length of a short side 225s is 400 μm to 650 μm (however, shorter than the length of the short side 215s and the length of the long side 225n).

When viewed on a plane, the pair of excitation electrodes 17 are smaller than the mesa part 225 and are contained in the major surface of the mesa part 225. In the pair of extraction electrodes 19, the pads 19a are positioned in the outer circumferential part 227, and the interconnect parts 19b stretch from the mesa part 225 to the outer circumferential part 227.

In the present embodiment as well, the vibration element 205 has a plate shaped crystal blank 215 having a pair of long sides 215n and pair of short sides 215s when viewed on a plane and a pair of excitation electrodes 17 superimposed on the two major surfaces of the crystal blank 215. Each of the pair of excitation electrodes 17 has a pair of short edges 17s extending along the pair of short sides 215s on inner sides of the pair of short sides 215s and a pair of long edges 17n extending along the pair of long sides 215n on inner sides of the pair of long sides 215n. The pair of short edges 17s are linear shaped parallel to the pair of short sides 215s, while the pair of long edges 17n are shaped bulging outward when viewed on a plane.

Accordingly, for example, the same effects as those by the first embodiment are exerted. For example, a standing wave dependent upon the distance between the long edges 17n and the long sides 215n can be made harder to occur, and design based on a rectangle is possible.

Further, in the present embodiment, the crystal blank 215 has a mesa part 225 on which the pair of excitation electrodes 17 are superimposed and an outer circumferential part 227 which is thinner than the mesa part 225 and surrounds the mesa part 225 when viewed on a plane. The mesa part 225, when viewed on a plane, is shaped having a pair of long sides 225n parallel to the pair of long sides 215n and a pair of short sides 225s parallel to the pair of short sides 215s. The pair of excitation electrodes 17 are smaller than the mesa part 225.

Accordingly, the shapes of the long edges 17n and short edges 17s of the excitation electrode 17 exert the same effects as those with respect to the long sides 215n and short sides 215s of the crystal blank 215 even with respect to the long sides 225n and short sides 225s of the mesa part 225. For example, a standing wave dependent upon the distance between the long edges 17n and the long sides 225n can be made harder to occur, and design based on a rectangular mesa part is possible.

The present invention is not limited to the above embodiments and may be worked in various ways.

The piezoelectric vibration device having a piezoelectric vibration element is not limited to the piezoelectric vibrator (crystal unit). For example, it may be an oscillator having, in addition to the piezoelectric vibration element, an integrated circuit element (IC) which applies voltage to the piezoelectric vibration element and generates an oscillation signal. Further, for example, the piezoelectric vibration device (piezoelectric vibrator) may be one having a thermistor or other electronic element other than a piezoelectric vibration element. Further, the piezoelectric vibration device may be one equipped with a thermostatic bath as well. In the piezoelectric vibration device, the structure of the package for packaging the piezoelectric vibration element may be made a suitable configuration. For example, the package may have an H-shaped cross-section so that a recess is provided in the upper surface and the lower surface.

The piezoelectric blank is not limited to a crystal blank. For example, the piezoelectric blank may be formed by a material obtained by injecting a dopant of metal or the like into a quartz crystal as well. However, a piezoelectric blank formed by a material obtained by injecting a dopant into a quartz crystal in this way may be grasped as one type of crystal blank as well. Further, the piezoelectric blank may be formed by for example a ceramic as well.

The piezoelectric vibration element is not limited to one utilizing thickness-slip vibration. When thickness-slip vibration is utilized, the piezoelectric blank (crystal blank) is not limited to an AT-cut plate. No matter what vibration mode is utilized, by a combination of the straight long sides of the piezoelectric blank and the outwardly bulging long edges of the excitation electrodes, some kind of effect is exerted. For example, a standing wave depending upon the distance between the two can be made harder to occur. For example, when thickness-slip vibration is utilized, the crystal blank may be a BT-cut plate as well.

The piezoelectric vibration element is not limited to one provided with a pair of pads (extraction electrodes) on one major surface and supported in a cantilever state. For example, the pair of extraction electrodes may extend from the pair of excitation electrodes in reverse directions to each other and the two ends of the piezoelectric vibration element may be supported. Further, the piezoelectric vibration element may be supported in an erect state with the use of a spring terminal or the like.

The long edge of the excitation electrode is not limited to an arc (curve having a constant curvature as over the whole). For example, the long edge may include a straight line in a portion or the curvature may change according to the position in the length direction. Further, for example, the excitation electrode may be shaped with the two ends in the long direction of the oval cut by a straight line perpendicular to the long axis. The long edge need not have a line symmetric shape with respect to a symmetric axis which is equally distant from the pair of short edges. For example, the center of the arc may be positioned on a line which is parallel to the pair of short edges but is closer to one of the pair of short edges than the other. Further, as a result, the pair of linear short edges may differ in length from each other.

As mentioned in the explanation of the embodiment, the long edge and/or short edge of the excitation electrode may be positioned not at the node of the standing wave by the bending vibration, but at the antinode. Further, the position of the long edge and/or short edge may be set without considering the standing wave due to the bending vibration.

The crystal blank is not limited to a flat plate shape and mesa type. For example, the crystal blank may be a so-called convex type or bevel type. Note that, the bevel type may be grasped as one type of flat plate shape if the amount of chamfering is small.

Where the piezoelectric vibration element is a mesa type, an excitation electrode may be broader than the mesa part as well. Even in this case, for example, since the distance between a long edge of the excitation electrode and a long side of the entire piezoelectric blank is not constant, the generation of the standing wave depending upon this distance is suppressed. Further, when the excitation electrode is broader or narrower than the mesa part, the shape of mesa part need not be rectangle either.

Priority is claimed on Japanese application No. 2016-232091 filed on Nov. 30, 2016, the content of which is incorporated herein by reference.

REFERENCE SIGNS LIST

1 . . . crystal unit (piezoelectric vibration device), 5 . . . crystal vibration element (piezoelectric vibration element), 15 . . . crystal blank 15 (piezoelectric blank), 15n . . . long side, 15s . . . short side, 17 . . . excitation electrode, 17n . . . long edge, and 17s . . . short edge.

The invention claimed is:
1. A piezoelectric vibration element comprising
a plate shaped piezoelectric blank having two major surfaces, each of the two major surfaces comprising a pair of long sides and pair of short sides and a pair of excitation electrodes superimposed on the two major surfaces of the piezoelectric blank, wherein, each of the pair of excitation electrodes comprises a pair of short edges extending along the pair of short sides on an inner sides of the pair of short sides and a pair of long edges extending along the pair of long sides on an inner sides of the pair of long sides, each of the pair of short edges is shaped as a straight line parallel to each of the pair of short sides, and each of the pair of long edges is shaped outwardly bulging to come close to each of the pair of long sides.

2. The piezoelectric vibration element according to claim 1, wherein the piezoelectric blank forms a flat plate shape.

3. The piezoelectric vibration element according to claim 1, wherein the piezoelectric blank comprises a mesa part on which the pair of excitation electrodes are superimposed and an outer circumferential part which is thinner than the mesa part and surrounds the mesa part when viewed on a plane, the mesa part is shaped so as to comprise a pair of second long sides which are parallel to the above pair of long sides and comprise a pair of second short sides which are parallel to the above pair of short sides, and the pair of excitation electrodes are smaller than the mesa part.

4. The piezoelectric vibration element according to claim 1, wherein, when the wavelength of the standing wave due to the bending vibration which propagates through the piezoelectric blank in the long direction thereof is $\lambda_L$, each of the pair of short edges is located within a range of $\frac{1}{8}\lambda_L$ from any node of the standing wave due to the bending vibration which propagates through the long direction.

5. The piezoelectric vibration element according to claim 1, wherein when the wavelength of the standing wave due to the bending vibration which propagates through the piezoelectric blank in the short direction thereof is $\lambda_W$, the central part of each of the pair of long edges is located within a range of $\frac{1}{8}\lambda_W$ from any node of the standing wave due to the bending vibration which propagates through the short direction.

6. The piezoelectric vibration element according to claim 1, wherein each of the pair of long edges forms a line symmetric curved shape having a line which is parallel to the pair of short edges and is equally distant from the pair of short edges as the symmetric axis.

7. The piezoelectric vibration element according to claim 1, further comprising a pair of extraction electrodes which are connected to the pair of excitation electrodes, wherein each of the pair of extraction electrodes is connected to only one of the pair of short edges among the pair of long edges and pair of short edges of the excitation electrode to which it is connected.

8. The piezoelectric vibration element according to claim 1, further comprising a pair of extraction electrodes which are connected to the pair of excitation electrodes, wherein the pair of extraction electrodes include a pair of pads arranged along one of the pair of short sides.

9. A piezoelectric vibration device comprising a piezoelectric vibration element according to claim 1 and a package packaging the piezoelectric vibration element.

* * * * *